United States Patent [19]

Schertz et al.

[11] 4,198,543
[45] Apr. 15, 1980

[54] STEREO COMPOSITE PROCESSOR FOR STEREO RADIO RECEIVER

[75] Inventors: Burtron D. Schertz, Kokomo; Wayne A. Smith, Russiaville, both of Ind.; Arthur R. Hammond, Boca Raton, Fla.

[73] Assignee: General Motors Corporation, Detroit, Mich.

[21] Appl. No.: 4,763

[22] Filed: Jan. 19, 1979

[51] Int. Cl.² .............................................. H04H 5/00
[52] U.S. Cl. ............................ 179/1 GM; 179/1 GJ
[58] Field of Search ............ 179/1 GM, 1 GJ, 1 GD, 179/1 GE, 100.1 TD, 100.4 ST; 325/36

[56] References Cited

U.S. PATENT DOCUMENTS

| | | | |
|---|---|---|---|
| 3,061,683 | 10/1962 | Freedman | 179/1 GS |
| 3,123,673 | 3/1964 | Stumpers | 179/1 GE |
| 3,198,885 | 8/1965 | Limberg | 179/1 GE |
| 3,258,537 | 6/1966 | Proctor et al. | 179/1 GE |
| 3,673,342 | 6/1972 | Muller | 179/1 GJ |
| 4,032,717 | 6/1977 | Mallon | 179/1 GJ |
| 4,063,039 | 12/1977 | Endres et al. | 179/1 GD |
| 4,087,641 | 5/1978 | Sugai | 179/1 GD |

Primary Examiner—Douglas W. Olms
Attorney, Agent, or Firm—Robert M. Sigler

[57] ABSTRACT

A radio receiver is effective to receive a radio frequency signal and derive therefrom a standard stereo composite signal comprising a sum of channels signal having components within a first band of frequencies in the audio range and a difference of channels signal having components within a second band of frequencies above the first band of frequencies. The radio receiver is provided with a low pass filter having a high frequency roll-off characteristic within the first frequency band and a substantially flat attenuated amplitude characteristic across the second frequency band. Linear mixer apparatus mixes filtered and unfiltered stereo composite signals in controlled relative proportion responsive to a control signal to produce a modified stereo composite signal for application to stereo decoder apparatus in order to simultaneously roll-off the high frequencies in each derived channel and to attenuate the difference of channels signal in degree controlled by the control signal. Control signal generating apparatus provides said control signal in response to a parameter indicative of noise in the stereo composite signal.

2 Claims, 4 Drawing Figures

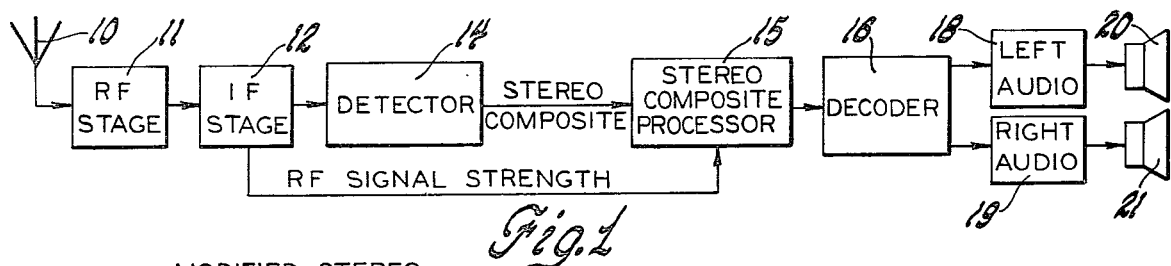
Fig. 1
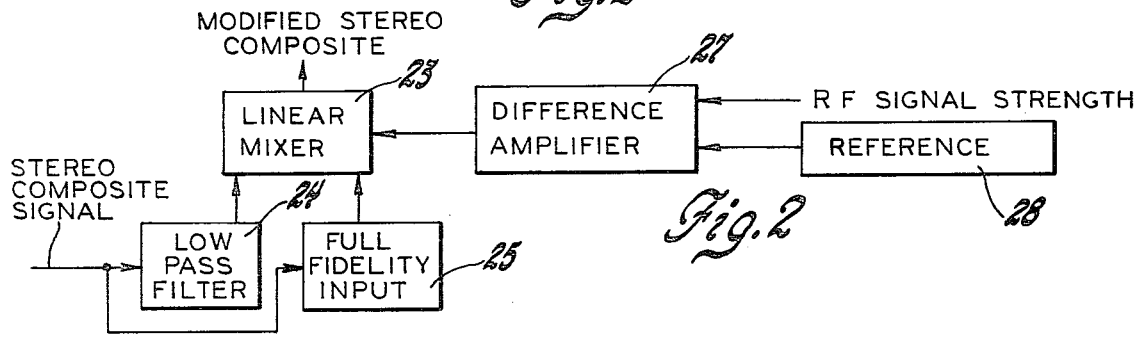
Fig. 2
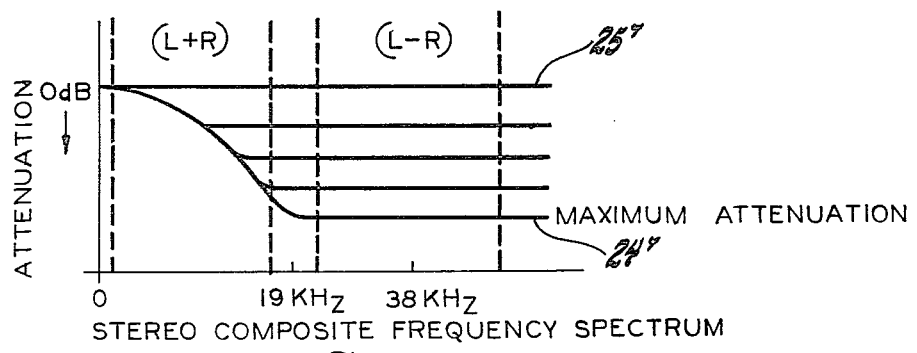
Fig. 3
Fig. 4

STEREO COMPOSITE PROCESSOR FOR STEREO RADIO RECEIVER

BACKGROUND OF THE INVENTION

This invention relates to stereo radio receivers and more particularly to such stereo receivers including apparatus effective to decrease objectionable high frequency noise.

Stereo receivers are generally adapted to receive a radio frequency signal, derive from it a stereo composite signal and decode the stereo composite signal into left and right channel audio frequency signals. In the case of an FM stereo RF signal the stereo composite signal generally comprises a sum of channels signal in the audio frequency range of approximately 30 to 15 kilohertz, which is required for monaural compatability, and a difference of channels signal comprising a set of side bands of a suppressed 38 kilohertz subcarrier, the side bands extending from 23 to 53 kilohertz, a frequency range above the audio frequency range.

Such FM stereo receivers are subject to the reproduction of noise along with the desired signals if said noise happens to be in the same frequency range as the signals. This noise may originate externally of the receiver, but it may also originate within the internal receiver circuits. The latter type of noise is especially objectionable in the higher audio frequencies and the frequency range of the difference of channels signal.

Many prior art FM stereo receivers have included apparatus for reducing objectionable noise in the reproduction of a received FM stereo signal. One of this type of receiver has been shown in the U.S. Pat. No. 3,952,161 to W. F. Gilbert et al. This receiver employs standard FM stereo receiver circuitry and methods for processing the received signal through the stereo decoder, where left and right channel audio signals are derived. These left and right channel signals are processed, however, by an audio processor which includes a high frequency roll-off filter for each channel to reduce the high frequencies where most of the objectionable noise exists and which further provides a blend of the two channels, which effectively cancels the portion of the difference of channels signal component in the two channels and thus reduces the noise in each audio channel originating as noise in the 23 to 53 kilohertz frequency band and being decoded along with the difference of channels signal. The amount of attenuation of the higher audio frequencies and the degree of blend of the two channels are simultaneously controllable in response to a control signal indicative of the noise level.

The apparatus and method of this receiver have been manufactured and sold on many vehicles by the assignee of this application and have been successfully received by the public. However, the audio processor requires a separate circuit chip added to the receiver circuitry between the stereo decoder and normal left and right channel audio amplifiers; and, within the chip, separate, identical circuits are required for each channel, along with the blend circuitry. This, of course, increases the cost of the receiver to the purchaser.

However, it has been discovered by the inventors of this invention that the similar high frequency roll-off of the higher audio frequencies and attenuation of the difference of channel signal may be obtained by the proper processing of the stereo composite signal before it is decoded into separate right and left channel signals. A low pass filter which has a high frequency roll-off characteristic in the audio frequency range and an extended constant attenuation characteristic in the difference of channels signal frequency range will produce a modified stereo composite signal which, when decoded, will produce the desired effect in the left and right channel audio signals. The circuitry for accomplishing this is considerably reduced in amount, and therefore in price and complexity, from that required for an audio processor that accomplishes the same result.

SUMMARY OF THE INVENTION

It is therefore an object of this invention to provide an improved stereo radio receiver which is adapted to reduce the objectionable high frequency stereo noise present in a detected stereo composite signal.

It is a further object of this invention to provide an improved FM stereo receiver which takes advantage of the nature of the stereo composite signal to provide high frequency roll-off in the audio range and attenuation of the difference of channels signal in a controlled degree without requiring separate identical processing circuits for each audio channel.

These objects and others are achieved in a stereo radio receiver including apparatus for modifying the stereo composite signal, which apparatus comprises a low pass filter having a high frequency roll-off within the audio frequency range and an extended flat attenuation through the higher frequency range of the suppressed subcarrier side bands. The apparatus further comprises a linear mixer adapted to mix signals of the stereo composite signal and the filtered stereo composite signal in relative proportion controlled by a control signal to produce a modified stereo composite signal output for application to the standard receiver decoder. The apparatus further comprises apparatus effective to generate the control signal in response to the difference between a parameter varying with signal noise and a reference. The control signal is adapted to control the linear mixer to generate a modified stereo composite which approaches the unfiltered stereo composite signal when the parameter indicates low noise and approaches the full filtered stereo composite signal when the parameter indicates high noise.

Further details and advantages of this invention will be apparent from the accompanying drawings and following description of a preferred embodiment.

SUMMARY OF THE DRAWINGS

FIG. 1 is a block diagram of a stereo radio receiver according to this invention.

FIG. 2 is a block diagram of a stereo composite processor for use in the receiver of FIG. 1.

FIG. 3 is a circuit diagram of an embodiment of the stereo composite processor of FIG. 2.

FIG. 4 is a graph showing a series of frequency spectra of the modified stereo composite signal produced by the stereo composite processor of FIGS. 2 and 3 for different values of the control signal or parameter.

DESCRIPTION OF THE PREFERRED EMBODIMENT

Referring to FIG. 1, a FM stereo receiver includes an antenna 10 effective to collect radio frequency signals and supply them to an RF stage 11. RF stage 11 includes a tuner with a relatively broad gain versus frequency response centered about an adjustable reception frequency and can further include radio frequency amplification means. In this embodiment, RF stage 11 may be considered to further include a local oscillator and mixer in the standard arrangement to produce an output at an intermediate frequency.

The output of RF stage 11 is provided to an IF stage 12 which comprises an intermediate frequency amplifier. The output of IF stage 12 is provided to a detector 14, which may be a standard quadrature detector, the output of which is the detected stereo composite signal if such a signal is present on the received RF signal. IF stage 12 may further includes means for generating an automatic gain control signal which is indicative of received RF signal strength. Such a signal can be provided to RF stage 11 in the normal manner in an AGC circuit.

The stereo composite signal from detector 14 is provided to stereo composite processor 15 which provides, at its output, a modified stereo composite signal. This modified signal is provided to decoder 16, which derives left and right channel audio frequency signals from the modified stereo composite signal and supplies these audio frequency signals to a left channel comprising left audio amplifier 18 and speaker 20 and a right channel comprising right audio amplifier 19 and speaker 21. With the exception of stereo composite processor 15, all other elements of the FM stereo receiver of FIG. 1 are standard and well known in the radio field. In addition, the specific circuits and elements comprising the blocks shown in FIG. 1 are not critical; and a wide choice is available in their selection among those circuits and elements known in the prior art.

Referring to FIG. 2, stereo composite processor 15 is shown in block diagram form. A linear mixer 23 has a pair of inputs, one of which receives the output of a low pass filter 24 and the other of which receives the output of a full fidelity input circuit 25. The stereo composite signal from detector 14 is provided to the inputs of both low pass filter 24 and full fidelity input circuit 25.

Linear mixer 23 is a circuit which mixes the two input signals linearly in controllable relative proportion so that the output comprises the sum of a particular percentage of one of said inputs and 100% minus the particular percentage of the other input signal. An example of such a linear mixer is the well known balanced current steering mixer or multiplier used in integrated circuits.

Full fidelity input circuit 25 comprises a circuit which is responsive to the stereo composite signal to reproduce said stereo composite signal in a form adapted to one input of linear mixer 23. In the case of a current steering mixer, full fidelity input circuit 25 comprises a current source which generates an output current varying in accordance with the stereo composite signal about a predetermined constant quiescent current.

Low pass filter 24 is an active device which subjects the stereo composite signal to a particular high frequency roll-off characteristic and generates an output signal according to said rolled off stereo composite in a form adapted for input to linear mixer 23. In the case of a current steering mixer, low pass filter 24 comprises a current source with a high frequency roll-off filter characteristic which generates a current similar to that of the full fidelity input circuit 25 but modified according to the specific filter characteristic.

The specific filter characteristic of low pass filter 24 can be seen with reference to the curves of FIG. 4. The horizontal axis of FIG. 4 shows the frequency range of the stereo composite signal, which includes components of a sum of channels or L+R signal in the audio range, generally between 30 and 15 kilohertz, and further contains components of a difference of channels or L−R signal in a higher frequency range from approximately 23 to 53 kilohertz, which second group of components comprises a pair of side bands about a suppressed subcarrier of 38 kilohertz. The particular desired filter characteristic comprises a roll-off or gradually increasing attenuation of the frequencies within the lower or sum of channels signal in the audio range down to a certain maximum attenuation near the upper end of said audio range and a further extended constant attenuation equal to this maximum attenuation completely across the upper frequency range of the difference of channels signal. This is shown as curve 24', which is the curve of maximum attenuation. The frequency characteristics of the filtered stereo composite output of low pass filter 24 is constant and is not changed; however, in response to a control signal, the modified stereo composite output of linear mixer 23 may have a frequency characteristic which varies between that of curve 24' and that of another curve 25' which represents the full fidelity input from circuit 25.

It can be seen in looking at the curves of FIG. 4 that a high frequency roll-off characteristic over the sum of channels signal combined with a constant characteristic across the difference of channels signal will result in equal high frequency roll-off characteristics in each channel after the stereo composite signal is decoded. In addition, it can be seen that an attenuation of the difference of channels signal with respect to the sum of channels signal in the composite will result in a reduced difference of channels component in each channel after the stereo composite signal is decoded. Thus one frequency characteristic modifying circuit and linear mixer applied to the stereo composite signal provides a result requiring two identical frequency characteristic modifying circuits and a channel blend circuit applied to the two channels of the audio portion of the receiver.

The control signal for linear mixer 23 is obtained from a difference amplifier 27 which has as one input the output of a reference signal generator 28, which generates a constant output reference, and, as another input, an RF signal strength indicating signal, which may be the AGC signal from IF stage 12. This AGC signal is a parameter which varies with received RF signal strength. Since lower strength signals require greater amplification, they produce greater noise when amplified; and this parameter is an acceptable indicator, in most cases, of noise level. Thus the controllable proportion of filtered and full fidelity signals combined in linear mixer 23 is controlled by a signal derived from a parameter varying with noise, the parameter being referenced to a constant. When the radio frequency signal strength is high, and noise is thus low, linear mixer 23 provides an output which approaches the full fidelity input or actual stereo composite signal from detector 14. However, when radio frequency signal strength becomes smaller, and noise thus increases, linear mixer 23 provides an output which more closely approaches the stereo composite signal modified by the maximum attenuation characteristic of low pass filter 24.

An alternative method of generating this parameter, which may be preferred in some cases, is to measure noise directly. One way of doing this is to apply a high pass filter to the output of the detector, the pass band of the filter being above the top of the difference of channels spectrum or 53 kilohertz. The output of the high pass filter may be detected to generate a DC noise signal.

FIG. 3 shows a circuit diagram of an embodiment of the stereo composite processor 15 adapted for manufacture as an integrated circuit on a circuit chip. An input 30 is provided for the stereo composite signal; and this input 30 is connected through a resistor 31 to the base of an NPN transistor 32 and also through a capacitor 33 to ground. Transistor 32 has an emitter connected through a resistor 34 to ground and through a resistor 35 to the base of an NPN transistor 36, which has an emitter connected through a resistor 37 to ground. The base of transistor 36 is also connected to a capacitor 38 to ground; and the collector of transistor 32 is connected to a positive bus 39 which is, in turn, connected at some point of the chip to a source of current at a regulated voltage potential. The grounds referred to are the ground of the circuit chip, which is itself connected at some point to the ground of the regulated power source. Elements 31–38 comprise the low pass filter 24 and are all contained on the integrated circuit chip except for capacitors 33 and 38 which, in practice, would be discrete capacitors connected to the circuit chip through inputs.

Input 30 is also connected through a resistor 41 to the base of an NPN transistor 42 having a collector connected to positive bus 39 and an emitter connected through a resistor 43 to ground. The emitter of transistor 42 is further connected through a resistor 44 to the base of an NPN transistor 45 having an emitter connected through a resistor 46 to ground. Elements 41–46 comprise the full fidelity input circuit 25 and are all contained on the integrated circuit chip. Linear mixer 23 comprises a first pair of NPN transistors 47 and 48 having emitters connected together and to the collector of transistor 36 and a second pair of NPN transistors 50 and 51 having emitters connected together and to the collector of transistor 45. The bases of transistors 48 and 50 are connected together; as are the bases of transistors 47 and 51. In addition, the collectors of transistors 47 and 50 are both connected to positive bus 39; while the collectors of transistors 48 and 51 are connected together and to the collector of a PNP transistor 53 and the base of another PNP transistor 54.

The emitter of transistor 54 is connected to the base of transistor 53 and further to the base of another PNP transistor 55. The emitters of transistors 53 and 55 are connected to the positive bus 39; and the collector of transistor 54 is grounded. The collector of transistor 55 is connected through a resistor 57 to ground and to the base of an NPN transistor 58, which has a collector connected to positive bus 39 and an emitter connected through a resistor 59 to ground. The emitter of transistor 58 is further connected to an output 60 for obtaining the modified stereo composite signal. Transistors 53–55 comprise a current mirror for the output of linear mixer 23; while transistor 58 and resistor 59 comprise an emitter follower output.

Reference generator 28 comprises a PNP transistor 62 having a grounded collector and an emitter connected through a resistor 63 to positive bus 39. The base of transistor 62 is connected to positive bus 39 through a resistor 64 and to ground through a resistor 65; so that resistor 64 and 65 form a voltage divider which fixes the operating point of transistor 62 and thus provides a constant reference voltage on the emitter thereof.

An input 67 is provided for the RF signal strength signal to the base of a PNP transistor 68, the collector of which is grounded and the emitter of which is connected through a resistor 69 to positive bus 39. The emitter of transistor 68 is also connected to the base of an NPN transistor 71, which has an emitter connected through a resistor 72 to the collector of an NPN transistor 73 having a grounded emitter. The base of transistor 73 is connected through a diode 74 to ground and through a resistor 75 to positive bus 39. The collector of transistor 73 is further connected through a resistor 76 to the emitter of an NPN transistor 77 having a base connected to the emitter of transistor 62.

A pair of series resistors 79 and 80 between positive bus 39 and ground have a junction 81 which is connected through a resistor 82 to the collector of transistor 71 and through a resistor 83 to the collector of transistor 77. Junction 81 is further connected to the base of an NPN transistor 84 having a collector connected to positive bus 39 and an emitter connected to the collector of transistor 71, and is also connected to the base of an NPN transistor 85 having a collector connected to positive bus 39 and an emitter connected to the collector of transistor 77. Finally, the collector of transistor 71 is connected to the bases of transistors 48 and 50 in linear mixer 23; and the collector of transistor 77 is connected to the bases of transistors 47 and 51 in linear mixer 23. Elements 68 through 85 comprise the difference amplifier 27 which has a balanced, double ended output connected to the transistors of linear mixer 23.

In operation, the RF signal strength signal 67 is applied through transistor 68 to one side of difference amplifier 27; while the reference voltage on the emitter of transistor 62 is applied to the other side. The operating points of transistors 71 and 77 are thus determined and the voltages on their collectors are supplied to the bases of the respective transistors 47–51 of linear mixer 23 to determine their operating points. Transistor 45 of full fidelity input circuit 25 generates a current varying with the stereo composite signal input; whereas transistor 36 of low pass filter 24 generates a current varying with the stereo composite signal input as modified by the filter action of the low pass filter combinations of resistor 31 with capacitor 33 and resistor 35 with capacitor 38. The transistors 47–51 of linear mixer 23, controlled by the voltages from the difference amplifier 27, mix the output currents of transistor 26 and transistor 45 in relative proportion determined by the output voltages of difference amplifier 27 to form an output collector current sum which is conveyed by the current mirror of transistors 53–55 to the emitter follower of transistor 58 and resistor 59, in which the signal is converted to a voltage equivalent and supplied as the modified stereo composite signal to decoder 16. Variations in the RF signal strength signal will vary the output voltages from difference amplifier 27 to draw the current sum from the collectors of transistors 48 and 51 more from transistors 45 and 51 when the radio frequency signal becomes stronger and more from transistors 36 and 48 when the radio frequency strength signal becomes weaker.

It may be noted that the filter characteristic of low pass filter 24 is a second order low pass characteristic. This appears to be the preferred characteristic, since it produces virtually no phase shift in the difference of channels signal and thus represents the best combination of phase performance and cost. Higher order low pass filters will exhibit even better phase performance which may not be necessary and which costs more to produce. A first order filter will exhibit greater phase shift in the difference of channels frequency range, but may be acceptable in some applications.

The embodiment as shown and described is preferred; but equivalents within the scope of the invention will undoubtedly occur to those skilled in the art. Therefore, the scope of the invention should be limited only by the following claims.

The embodiments of the invention in which an exclusive property or privilege is claimed are defined as follows;

1. In a radio receiver having means effective to receive a radio frequency signal, to derive therefrom a stereo composite signal comprising a sum of channels signal having frequency components in the audio range and a difference of channels signals having frequency components in another frequency range above the audio range, and to decode the stereo composite signal into a first channel signal for application to a first audio channel and a second channel signal for application to a second audio channel, a stereo composite processor comprising, in combination:

low pass filter means having a high frequency roll-off attenuation characteristic within the audio range and a substantially flat attenuation across the other frequency range, the low pass filter being effective to filter the stereo composite signal and thus produce a high frequency roll-off attenuation in the sum of channels signal and a flat attenuation in the difference of channels signal;

linear mixer means effective to mix the stereo composite signal and filtered stereo composite signal in controlled relative proportion in response to a control signal to produce a modified stereo composite signal;

means effective to apply the modified stereo composite signal to the decoding means; and means effective to generate the control signal in response to a parameter indicative of noise in the stereo composite signal, the control signal varying in sense to decrease the attenuation in the modified stereo composite signal and thus decrease high frequency roll-off and difference of channels signal attenuation in the audio channels for low noise levels and to increase attenuation in the modified stereo composite signal and thus increase high frequency roll-off and difference of channels signal attenuation for high noise levels.

2. In a radio receiver having means effective to receive a radio frequency signal, to derive therefrom a stereo composite signal comprising a sum of channels signal having frequency components in the audio range and a difference of channels signal having frequency components in another frequency range above the audio range, and to decode the stereo composite signal into a first channel signal for application to a first audio channel and a second channel signal for application to a second audio channel, a stereo composite processor comprising, in combination:

a low pass filter effective to receive and filter the stereo composite signal, the filter being of the type having an attenuation characteristic providing attenuation increasing with frequency within the audio range and constant attenuation across the other frequency range;

first and second signal controlled current source transistors, the first being controlled by the stereo composite signal and the second by the filtered stereo composite signal;

a double balanced mixer comprising first and second pairs of differentially coupled transistors, the emitters of the first pair being coupled to the output of the first current source transistor and the emitters of the second pair being coupled to the output of the second current source transistor, one transistor of each pair comprising an output transistor and having a collector coupled to the collector of the other;

a constant voltage signal source;

means effective to generate a control signal in response to a parameter indicative of noise in the stereo composite signal; and differential amplifier means having a first input coupled to the constant voltage signal source, a second input coupled to the control signal generating means and an output connected across the bases of each of the first and second pairs of differentially coupled transistors and simultaneously across the bases of the output transistors, whereby the stereo composite signal and filtered stereo composite signal are mixed linearly in controlled relative proportion to form a modified stereo composite signal having high audio frequency roll-off and flat difference of channels signal attenuation in amount controlled by the noise indicating parameter.

* * * * *